(12) United States Patent
Katoh

(10) Patent No.: US 7,126,163 B2
(45) Date of Patent: Oct. 24, 2006

(54) LIGHT-EMITTING DIODE AND ITS MANUFACTURING METHOD

(75) Inventor: Masaaki Katoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/086,155

(22) Filed: Feb. 26, 2002

(65) Prior Publication Data

US 2002/0117676 A1  Aug. 29, 2002

(30) Foreign Application Priority Data

Feb. 26, 2001  (JP)  ............................. 2001-050558
Feb. 19, 2002  (JP)  ............................. 2002-041913

(51) Int. Cl.
*H01L 33/00* (2006.01)
*H01L 27/15* (2006.01)
*H01L 31/12* (2006.01)

(52) U.S. Cl. ............................. 257/99; 257/79; 257/98

(58) Field of Classification Search ........... 257/79–103
See application file for complete search history.

(56) References Cited

U.S. PATENT DOCUMENTS

| 5,670,797 | A |   | 9/1997 | Okazaki |
| 5,814,837 | A |   | 9/1998 | Okazaki |
| 5,882,949 | A |   | 3/1999 | Okazaki |
| 6,121,636 | A | * | 9/2000 | Morita et al. ................. 257/99 |
| 2002/0117672 | A1 | * | 8/2002 | Chu et al. ..................... 257/79 |
| 2004/0051109 | A1 | * | 3/2004 | Ishizaki et al. ............... 257/89 |

FOREIGN PATENT DOCUMENTS

| JP | 49-107272  | 10/1974 |
| JP | 1-163352   | 11/1989 |
| JP | 01-283883  | 11/1989 |
| JP | 06-302857  | 10/1994 |
| JP | 06-326365  | 11/1994 |
| JP | 07-283439  | 10/1995 |
| JP | 08-213660  | 8/1996  |
| JP | 09-036432  | 2/1997  |
| JP | 10-125959  | 5/1998  |

* cited by examiner

Primary Examiner—Shouxiang Hu
(74) Attorney, Agent, or Firm—Morrison & Foerster LLP

(57) ABSTRACT

The present invention provides a surface-mounted LED that is easy to be made thin and having high reliability, as well as provides its manufacturing method.

Specifically, the present invention provides a light-emitting diode having a light-emitting diode chip mounted on a surface of a printed substrate, this light-emitting diode chip comprising a substrate; a semiconductor layer laminated on the substrate and comprising an N-type semiconductor layer and a P-type semiconductor layer, wherein its PN junction surface is perpendicular to the surface of the printed substrate and a portion in the vicinity of the PN junction surface is rendered to be a light-emitting portion; a pair of electrodes that applies voltage to the semiconductor layer; and a light reflecting layer formed on the front surface or back surface of the light-emitting chip or in the chip so as to be approximately parallel to the PN junction surface, this light reflecting layer reflecting light emitted from the light-emitting portion.

4 Claims, 6 Drawing Sheets

PRIOR ART

PRIOR ART

PRIOR ART

LIGHT-EMITTING DIODE AND ITS MANUFACTURING METHOD

CROSS-REFERENCE TO RELATED APPLICATIONS

This application claims priority to Japanese Patent Application Number 2001-050558 filed Feb. 26, 2001, and Japanese Patent Application Number 2002-41913 filed Feb. 19, 2002, the contents of which are incorporated herein by reference in their entireties.

BACKGROUND OF THE INVENTION

1. Field of the Invention

The present invention relates to a light-emitting diode and its manufacturing method, and more particularly to a substrate type surface-mounted light-emitting diode (hereinafter simply abbreviated to LED) with a side emission and its manufacturing method, this surface-mounted LED including an LED chip mounted on a printed substrate such that the PN junction surface of the chip is perpendicular to the printed substrate surface.

2. Description of the Prior Arts

Conventional side-emitting LEDs include the following three types.

The first type is disclosed in Japanese Published Utility Model Application No. HEI1(1989)-163352. This LED is manufactured as follows. LED chips 101 are die-bonded to electrodes 102a and 102b on a relatively thick printed substrate 102, and wire-bonding is made using Au lines 103. Subsequently, molding is performed to form a mold resin portion 104, followed by dicing. Each LED chip 101 is uprighted for use (see FIG. 7). This type of LED is generally called a side-emitting LED.

The second type is disclosed in Japanese Published Unexamined Patent Application No. HEI1(1989)-283883. This LED is a surface-mountable type wherein a light-emitting portion is arranged sideways with respect to the LED chip 101 that is assembled in an insert-molded frame provided with a reflector 105 (see FIG. 8). The numeral 103 denotes an Au line.

The third type is disclosed in Japanese Published Unexamined Patent Application No. HEI10(1998)-125959. This LED is manufactured as follows. An LED chip (not shown) is die-bonded and wire-bonded on a relatively thin printed substrate 102. Then, the resultant is sealed with a dome-like transparent resin portion 106. The transparent resin portion 106 is then covered with a white resin portion 107 serving as a reflector, to thereby complete the LED (see FIG. 9). The LED emits light P101 from an opening 107a provided at the white resin portion 107.

The aforementioned three types of LEDs are obtained by using a general LED bare chip as it is.

However, these LEDs have the following problems. Specifically, the first type LED, although it is easy to make this LED thin, has a problem that the LED chip is proximal to the printed substrate where the chip should be mounted. It also has another problem that solder flux is permeated from the space between the mold resin and the substrate for the LED chip, to thereby pollute the LED chip.

The second and third types have a problem that it is difficult to make them thin since they have a structure including the reflector. The minimum thickness is about 0.8 mm.

SUMMARY OF THE INVENTION

The present invention is accomplished in view of the above circumstances, and aims to provide a surface-mounted LED that is easy to be made thin and having high reliability, and its manufacturing method.

The present invention provides a light-emitting diode comprising a light-emitting diode chip mounted on a surface of a printed substrate, the light-emitting diode chip including:

a substrate;

a semiconductor layer laminated on the substrate and formed of an N-type semiconductor layer and a P-type semiconductor layer, wherein its PN junction surface is perpendicular to the surface of the printed substrate and a portion in the vicinity of the PN junction surface is rendered to be a light-emitting portion;

a pair of electrodes for applying voltage to the semiconductor layer; and a light reflecting layer formed on a front surface or a back surface of the light-emitting chip or in the light-emitting chip so as to be approximately parallel to the PN junction surface, this light reflecting layer reflecting light emitted from the light-emitting portion.

According to the present invention, the light-emitting diode chip has the N-type semiconductor layer and the P-type semiconductor layer, their PN junction surface being perpendicular to the surface of the printed substrate, and has the light-emitting portion in the vicinity of the PN junction surface. Further, the light-emitting diode chip of the present invention has the light reflecting layer formed on the front surface or back surface of the light-emitting chip or in the chip so as to be approximately parallel to the PN junction surface, this light reflecting layer reflecting light emitted from the light-emitting portion. Therefore, light emitted from the light-emitting portion is reflected on the light reflecting layer so as to be converged and taken out, whereby the emission efficiency can be enhanced.

Further, according to the present invention, the laminate direction of the semiconductor layer can be set to the direction along the surface of the printed substrate and the electrode pair of the chip can be arranged closely to the printed substrate. This can make thin the height of the chip, i.e., the thickness of the chip. Additionally, wire bonding is unnecessary by this structure.

The light reflecting layer is formed on the front surface or back surface of the light-emitting diode chip or in the chip in the present invention. Specifically, the light reflecting layer is formed on the front surface (inside the light-emitting diode chip in this case) or back surface of the transparent substrate or on the front surface of the semiconductor layer.

Examples of the preferable light reflecting layer include a metal thin film obtained by a direct formation by an indirect formation via a dielectric thin film on the back surface of the transparent substrate, or directly formed on the surface of the substrate. The metal thin film may be formed of a Ni vapor-deposition film having a thickness of 100 nm or more. In case where the light reflecting layer is formed on the back surface of the transparent substrate via the dielectric film, the dielectric film may be formed by $SiO_2$ film or $Al_2O_3$ film having a thickness of 3 to 60 nm, while the metal thin film may be formed of a AuBe vapor-deposition film or Au vapor-deposition film having a thickness of 3 to 60 nm. Forming the metal thin film on the back surface of the substrate via the dielectric film is preferable since this structure can provide a reflection mirror to the LED chip having two chip electrodes formed respectively on the front surface and back surface of the transparent substrate.

The present invention includes a DBR (Distributed Bragg Reflector) diffraction grating structure as an example of the light reflecting layer formed in the light-emitting diode chip. This is because the transparent substrate having the DBR diffraction grating structure on its surface can reflect light by the diffraction grating structure itself.

The transparent substrate is preferably a substrate transparent to the color emitted by the LED chip.

This structure can prevent that the emission is disturbed by the transparent substrate.

In another aspect, the present invention provides a method for manufacturing a light-emitting diode comprising mounting, on a surface of a printed substrate, a light-emitting diode chip having a substrate, a semiconductor layer which is laminated on a surface of the substrate, is formed of an N-type semiconductor layer and a P-type semiconductor layer and has a light-emitting portion in the vicinity of a PN junction surface between the N-type and P-type semiconductor layers, and a pair of electrodes for applying voltage to the semiconductor layer, thereby obtaining the light-emitting diode, the method comprising, for mounting the light-emitting diode chip on the printed substrate, the step of forming beforehand a light reflecting layer for reflecting light emitted from the light-emitting portion, on a front surface or a back surface of the printed substrate of the light-emitting diode chip or in the light-emitting diode chip in such a manner that the light reflecting layer is approximately parallel to the PN junction surface, and the step of fixing the obtained light-emitting diode chip on the printed substrate so that the PN junction surface is perpendicular to the surface of the spring substrate and electrically connecting the pair of electrodes of the light-emitting diode chip to the printed substrate.

The manufacturing method of the light-emitting diode according to the present invention can make the mold resin thin. Further, the wire bond is unnecessary by this method.

BRIEF DESCRIPTION OF THE DRAWINGS

The present invention will become more fully understood from the detailed description given hereinbelow and the accompanying drawings that are given by way of illustration only, and thus are not to be considered as limiting the present invention.

DESCRIPTION OF THE PREFERRED EMBODIMENT

Explained hereinbelow is a preferred embodiment of a surface-mounted LED and its manufacturing method according to the present invention.

The present embodiment utilizes a blue LED chip or green LED chip of GaN group as one example of an LED chip.

Figure 1:
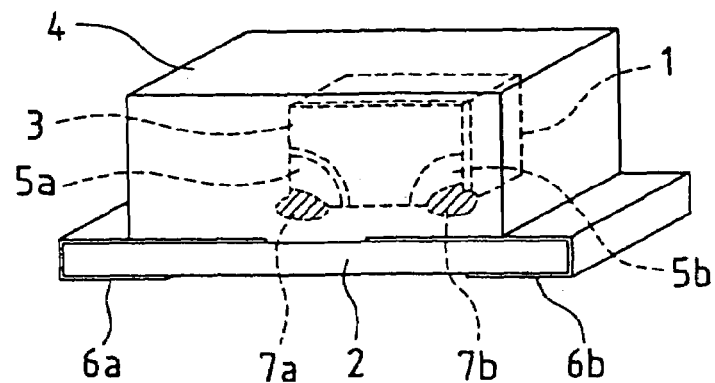
FIG. 1 is a perspective view showing one embodiment of a surface-mounted LED according to the present invention.

FIG. 1 is a perspective view showing one embodiment of a surface-mounted LED according to the present invention.

Shown in this embodiment is a substrate type side-emitting surface-mounted LED wherein an LED chip 1 is mounted on a substrate 2 such that a PN junction of the LED chip 1 is perpendicular to the substrate surface.

A light reflecting layer is provided at one surface of the LED chip. The present embodiment utilizes a reflection mirror 3, serving as the light reflecting layer, provided on a surface parallel to the PN junction surface.

The surface of the LED chip 1 is covered with a mold resin portion 4 (for example, made of epoxy resin as a translucent resin). Two chip electrodes 5a and 5b are electrically connected to two LED electrodes 6a and 6b mounted on the printed substrate 2 with soldering pastes 7a and 7b. A silver paste may be used instead of the soldering pastes 7a and 7b.

Subsequently, one preferred embodiment of a manufacturing method of a surface-mounted LED according to the present invention will be explained.

Figure 2:
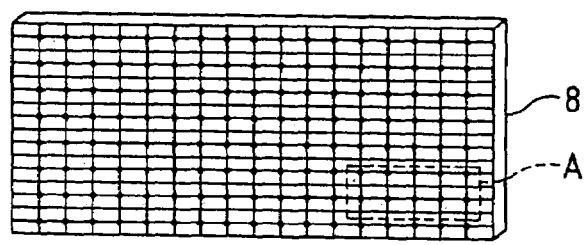
FIG. 2 is an explanatory view of GaN wafer used for manufacturing a surface-mounted LED of the present invention.
Figure 2:
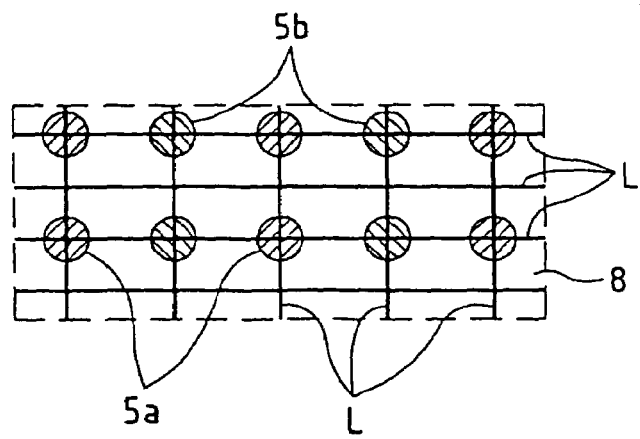
Figure 3:
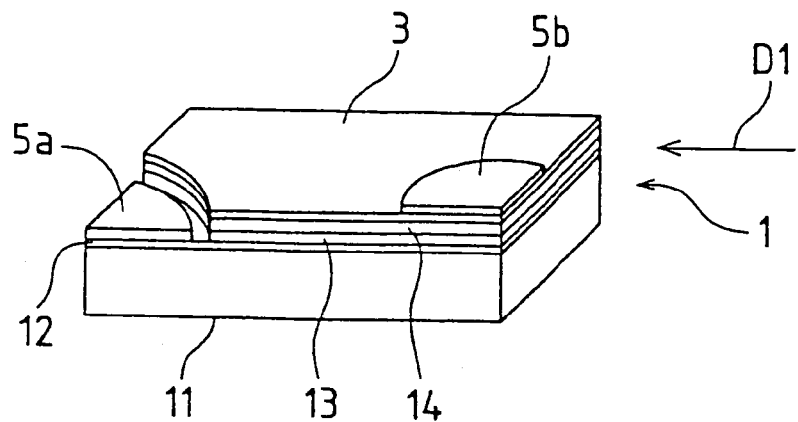
FIG. 3 is a perspective view showing an LED chip obtained by dicing the GaN wafer shown in FIG. 2.
Figure 4:
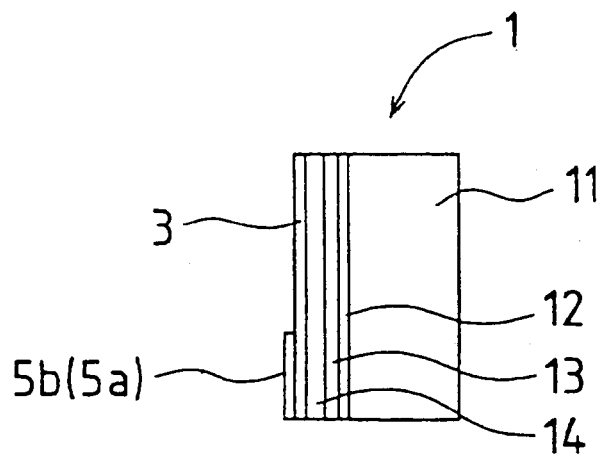
FIG. 4 is a side view showing the LED chip shown in FIG. 3 that is raised up at an angle of 90 degrees and seen from the direction shown by an arrow D1.

FIG. 2 is an explanatory view showing GaN wafer used upon manufacturing the surface-mounted LED of the present invention, wherein FIG. 2(a) is a perspective view showing one example of the GaN wafer and FIG. 2(b) is a partially enlarged view showing an area A shown in FIG. 2(a). FIG. 3 is a perspective view showing an LED chip obtained by dicing the GaN wafer shown in FIG. 2, while FIG. 4 is a side view showing the LED chip shown in FIG. 3 that is raised up at an angle of 90 degrees and seen from the direction D1.

Firstly, an N-type AlGaInN clad layer 12, an AlGaInN light-emitting layer 13 and a P-type AlGaInN clad layer 14 are grown by a vapor-phase epitaxy on an insulating transparent substrate 11 such as a sapphire substrate. A light-emitting portion is formed on the light-emitting layer 13. The PN junction surface is formed between the light-emitting layer 13 and the clad layer 14. Subsequently, the P-type AlGaInN clad layer 14 and the AlGaInN light-emitting layer 13 are etched at a predetermined position to thereby expose a portion of the N-type AlGaInN clad layer 12. Ti/Al is vapor-deposited on the exposed portion (mesa-etch portion) of the N-type AlGaInN clad layer 12 to form a chip electrode 5a as an N-electrode with a thickness of 7 nm or more.

Ni is vapor-deposited on almost the entire surface of the P-type AlGaInN clad layer 14 to form the reflection mirror 3 with a thickness of 100 nm or more. Then, a metal is vapor-deposited at a predetermined position above the P-type AlGaInN clad layer 14 through the reflection mirror 3, to thereby form the chip electrode 5b as a P-electrode with a thickness of 400 nm. Thus, a GaN wafer 8 is obtained.

The GaN wafer 8 obtained in this way is diced in the X-Y direction (along a dicing line L shown in FIG. 2(b)), to thereby divide the wafer into the LED chips 1 each having a length of 150 micrometers, a width of 300 micrometers and a thick of 200 micrometers. The dicing line L is arranged in a matrix. Specifically, the dicing line L in the X-direction (lateral direction) is arranged such that the line L crossing the chip electrode 5a or 5b and the line L not crossing the same electrode are alternatively arranged.

Thereafter, the LED chip 1 is rotated at an angle of 90 degrees to put up the LED chip 1 (see FIG. 4). At this time, the LED chip 1 is put up such that two chip electrodes 5a and 5b are arranged at the lower edge portion of one side of the LED chip 1.

Each LED chip 1 is mounted on the printed substrate 2 with the above-mentioned state, as shown in FIG. 1, by the same manner as is generally performed (for example, by the manner disclosed in Japanese Unexamined Patent Application No. HEI9(1997)-36432).

The technique for mounting the LED chip 1 on the substrate includes the following steps. Firstly, an adhesive (for example, epoxy resin) has been applied in advance on a predetermined position of the printed substrate 2. Each LED 1 that is put up is mounted on this adhesive, and then, the adhesive is cured to thereby mount the LED chip 1 on the printed substrate (the PN junction surface is perpendicular to the surface of the printed substrate 2). Thereafter, the printed substrate 2 having the LED chip 1 mounted thereon is dipped in the soldering solution, or alternatively, the soldering paste is applied in the vicinity of the chip electrodes 5a, 5b and the LED electrodes 6a, 6b for executing the reflowing, whereby the chip electrodes 5a, 5b are electrically connected to the LED electrodes 6a, 6b.

The soldering paste is adhered on the chip electrode 5a on the N-type AIGaInN clad layer 12 formed by vapor-depositing the Ti/Al and the chip electrode 5b on the P-type AIGaInN clad layer 14 formed by vapor-depositing the metal. On the other hand, the soldering paste is not adhered on the reflection mirror 3 formed by vapor-depositing Ni. Therefore, short-circuit does not occur on the chip electrode 5a on the N-type AIGaInN clad layer 12 and the chip electrode 5b on the P-type AIGaInN clad layer 14 due to the soldering paste.

Further, the mold resin portion 3 is formed as shown in FIG. 1 by coating a resin with a transfer mold.

Then, the printed substrate is diced in the X-direction for dividing each LED chip 1 by the same manner as is generally performed (for example, by the manner disclosed in Japanese Unexamined Patent Application No. HEI9-36432), to thereby obtain a surface-mounted LED.

The surface-mounted LED has the structure as described above and manufactured by the manner described above, so that emission from the AIGaInN light-emitting layer can be collected with the reflection mirror on the surface opposite to the surface on which the chip electrode is formed. Consequently, the emission efficiency can be enhanced.

Although the above-mentioned embodiment utilizes the GaN group LED chip using the sapphire substrate as the transparent substrate, the present invention can be applied to all the LED chips using a substrate transparent to the emitting color. For example, the present invention can be applied to a GaInN type LED chip that uses SiC substrate as the transparent substrate, an infrared LED chip that uses GaAs substrate as the transparent substrate and emits light at a band of 940 nm, a GaAsP LED chip that uses GaP substrate as the transparent substrate, and an InGaAsP based quarternary LED chip (disclosed in Japanese Unexamined Patent Application No. HEI6(1994)-302857) in which GaP substrate is adhered as the transparent substrate.

Further, the present invention can be applied to various LED chips disclosed in Japanese Unexamined Patent Application No. HEI6(1996)-302857.

Subsequently explained is a preferred embodiment wherein the present invention is applied to these LED chips.

Figure 5:
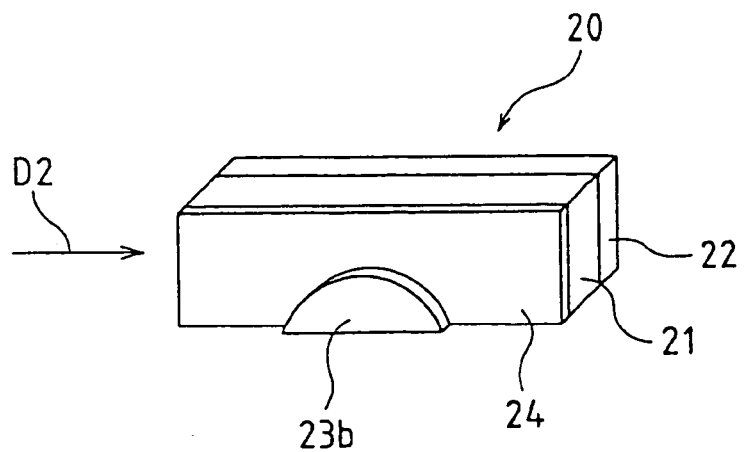
FIG. 5 is a perspective view showing another embodiment of a surface-mounted LED according to the present invention.
Figure 6:
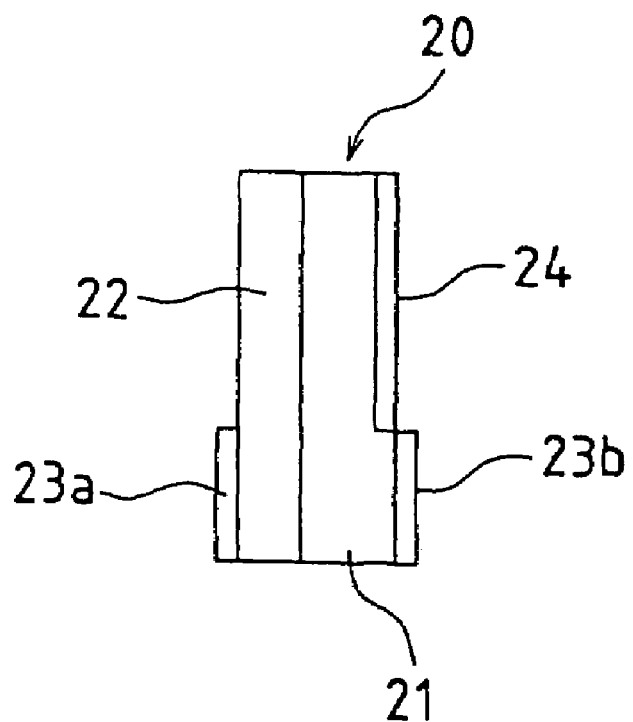
FIG. 6 is a side view showing the LED chip shown in FIG. 5 as seen from the direction shown by an arrow D2.
Figure 7:
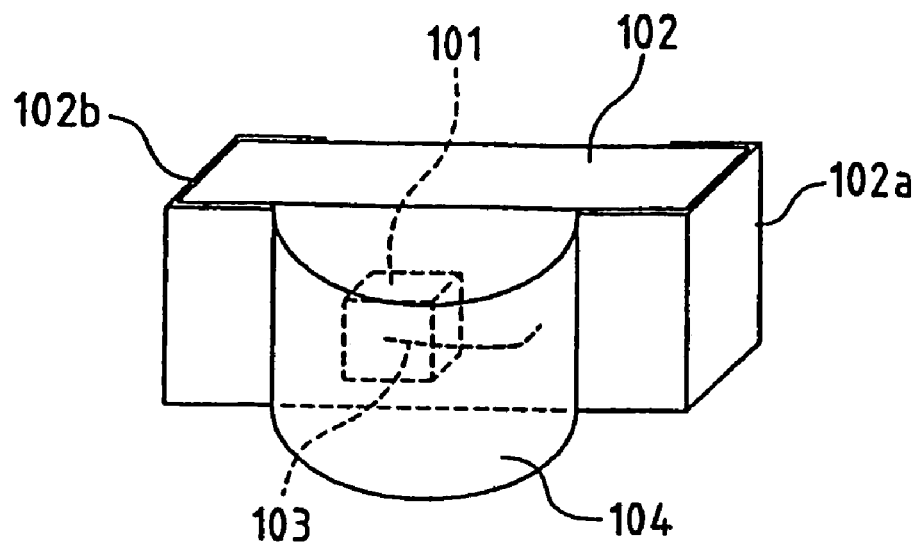
FIG. 7 is a perspective view showing one example of a conventional side-emitting LED.
Figure 8:
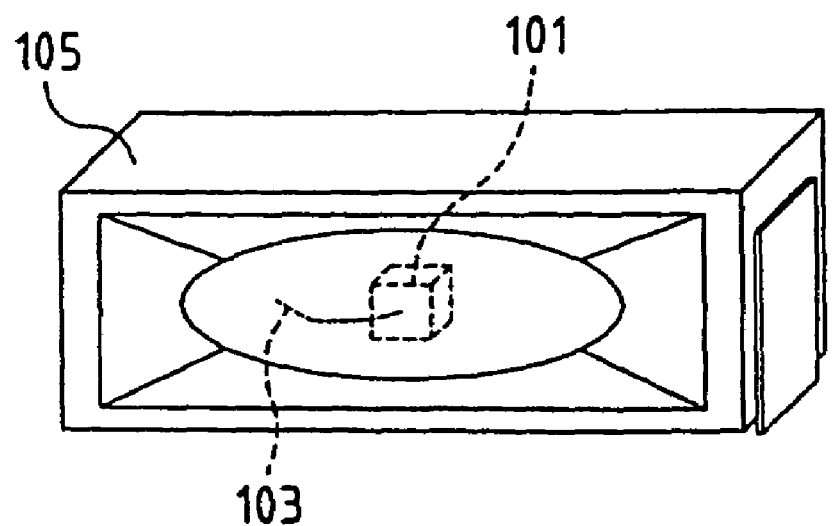
FIG. 8 is a perspective view showing another example of a conventional side-emitting LED.
Figure 9:
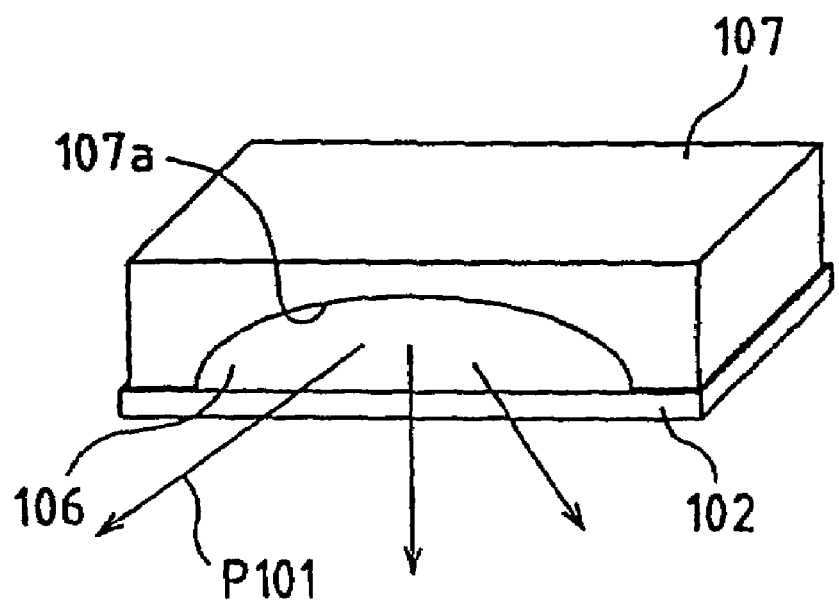
FIG. 9 is a perspective view showing another example of a conventional side-emitting LED.

FIG. 5 is a perspective view showing another embodiment of a surface-mounted LED according to the present invention while FIG. 6 is a side view showing the LED chip seen from the direction shown by an arrow D2.

This LED chip 20 utilizes a substrate having a conductivity and transparency as the transparent substrate 21. Formed on the surface of the transparent substrate 21 is a semiconductor layer 22 comprising an N-type semiconductor layer, a light-emitting layer and a P-type semiconductor layer. One chip electrode 23a is formed on a predetermined position on the surface of the semiconductor layer 22, while the other chip electrode 23b is formed at a predetermined position on the back surface of the transparent substrate 21.

A reflection mirror 24 is also formed on the back surface of the transparent substrate 21 with the chip electrode 23b.

Forming the reflection mirror 24 and the chip electrode 23b includes the following steps. Firstly, $SiO_2$ or $Al_2O_3$, for example, is vapor-deposited on the back surface of the transparent substrate 21 to form a dielectric thin film. A hole having a diameter of 80 micrometers is punched at the predetermined position (the position where the chip electrode 23b is formed later) of the dielectric thin film (FIGS. 5 and 6 show the chip electrodes 23a and 23b after dividing the chip by performing the dicing process such that the dicing line passes through the center of the hole). Then, AuBe, Au are vapor-deposited on the whole surface of the dielectric thin film, followed by performing a heat treatment, whereby the chip electrode 23b can be formed at the position where the hole has been formed, as well as the reflection mirror 24 can be formed in the vicinity of the chip electrode 23b on the back surface of transparent substrate 21.

An LED manufactured by using, other than the aforementioned LED chip, an LED chip using, instead of the transparent substrate, a substrate provided with a reflection mirror layer having DBR (Distributed Bragg Reflector) structure on its surface affords the same effect as obtained by the surface-mounted LED in the aforementioned embodiment.

As described above, the surface-mounted LED of the present invention is a side-emitting type comprising an LED chip provided with a transparent substrate; a semiconductor layer formed on the surface of the transparent substrate and including an N-type semiconductor layer, a light-emitting layer and a P-type semiconductor layer; and a pair of electrodes for applying voltage to the semiconductor layer, wherein the LED chip is mounted on a printed substrate such that the PN junction surface of the semiconductor layer is perpendicular to the surface of the substrate, and wherein a light reflecting layer is provided on one surface of the LED chip. According to the present invention, a side-emitting surface-mounted LED can be obtained with a thickness of 0.35 mm even if a printed substrate is made to have a thickness of 0.1 mm, an LED chip is made to have a height of 0.15 mm and a mold resin covering this LED chip is made to have a thickness of 0.25 mm. Therefore, the present invention can afford a thinner-sized LED. The surface-mounted LED of the present invention has a structure of not requiring a wire bonding that uses a metal wire, whereby a defective in wire bonding that shows the highest incidence rate among the defective causes of LED does not occur, thereby improving reliability of the LED.

The transparent substrate that is transparent to the emitting color of the LED chip can take out the emitting light from the LED chip and the reflecting light from the reflection mirror from the back surface of the transparent substrate, whereby the emission efficiency can be improved.

In case where the light reflecting layer is formed by the dielectric film mounted on the back surface of the transparent substrate and the metal thin film mounted on this dielectric film, a reflection mirror can also be disposed on the LED chip having a structure that two chip electrodes are formed respectively on the front surface and back surface of the transparent substrate. This shows that an LED having a satisfactory emission efficiency can be manufactured according to the present invention by using various types of LED chips.

The present invention provides a method for manufacturing a side-emitting surface-mounted LED in which an LED chip comprising a transparent substrate, a semiconductor layer comprising an N-type semiconductor layer, a light-emitting layer and a P-type semiconductor layer, and a pair of electrodes for applying voltage to the semiconductor layer is mounted on a printed substrate such that the PN junction surface of the semiconductor layer is perpendicular to the surface of the printed substrate, this method comprising a step of forming a light reflecting layer in the LED chip or on one surface of the LED chip and a step of fixing the obtained LED chip on the printed substrate and then performing an electrical connection between the LED chip and the printed substrate by using a soldering paste or silver paste. According to the present invention, a side-emitting surface-mounted LED can be obtained with a thickness of 0.35 mm even if a printed substrate is made to have a thickness of 0.1 mm, an LED chip is made to have a height of 0.15 mm and a mold resin covering this LED chip is made to have a thickness of 0.25 mm. Therefore, the present invention can afford a thinner-sized LED. The surface-mounted LED of the present invention has a structure of not requiring a wire bonding that uses a metal wire, whereby a defective in wire bonding that shows the highest incidence rate among the defective causes of LED does not occur, thereby improving reliability of the LED.

A light-emitting diode chip of the present invention has a semiconductor layer laminated on a substrate and comprising an N-type semiconductor layer and a P-type semiconductor layer, wherein its PN junction surface is perpendicular to the surface of the printed substrate and a portion in the vicinity of the PN junction surface is rendered to be a light-emitting portion. Further, the light-emitting diode chip of the present invention has a light reflecting layer formed on the front surface or back surface of the light-emitting chip or in the chip so as to be approximately parallel to the PN junction surface, this light reflecting layer reflecting light emitted from the light-emitting portion. Therefore, light emitted from the light-emitting portion is reflected on the light reflecting layer so as to be converged and taken out, whereby the emission efficiency can be enhanced.

Further, the present invention can provide setting the laminate direction of the semiconductor layer to the direction along the surface of the printed substrate and arranging the electrode pair of the chip so as to be proximate to the printed substrate. This can make the height of the chip, i.e., the thickness of the chip thin. Additionally, wire bond is unnecessary by this structure.

What is claimed is:

1. A light-emitting diode comprising a light-emitting diode chip mounted on a surface of a printed substrate, the light-emitting diode chip including:
    a transparent substrate;
    a semiconductor layer laminated on the transparent substrate and formed of an N-type semiconductor layer and a P-type semiconductor layer, wherein a PN junction interface between the N-type and P-type semiconductor layers is perpendicular to the surface of the printed substrate, the semiconductor layer including:
    a light-emitting portion in the vicinity of the PN junction interface; and
    a first face and a second face, both the first face and the second face parallel to the transparent substrate wherein the first face is in contact with the transparent substrate;
    a first corner and a second corner adjacent to the surface of the printed substrate;
    a pair of electrodes for applying voltage to the semiconductor layer;
    a light reflecting layer formed of a metal thin film formed on the second face of the semiconductor layer substantially parallel to the PN junction interface and for reflecting light emitted from the light-emitting portion; and
    a recessed section formed only at the first corner of the semiconductor layer adjacent to the printed substrate, the recessed section formed by removing a portion of the light reflecting layer and a portion of the semiconductor layer to form an exposed surface of one of the N-type semiconductor layer and the P-type semiconductor layer;
    wherein a first electrode of the pair of electrodes is formed only at the second corner on the light reflecting layer and a second electrode of the pair of electrodes is formed on the exposed surface adjacent to the printed substrate.

2. A light-emitting diode claimed in claim 1, wherein the metal thin film has a thickness of 100 nm or more.

3. A light-emitting diode claimed in claim 2, wherein the transparent substrate is transparent to color emitted by the light-emitting diode chip.

4. A light-emitting diode claimed in claim 1, wherein the transparent substrate is transparent to color emitted by the light-emitting diode chip.

* * * * *